United States Patent
Flowers et al.

(10) Patent No.: US 6,734,599 B1
(45) Date of Patent: *May 11, 2004

(54) SYSTEM AND METHOD FOR DISSIPATING STATIC CHARGE GENERATED IN A SURFACE ACOUSTIC WAVE DEVICE

(75) Inventors: James E. Flowers, Dallas, TX (US); Martin Ivie, Allen, TX (US)

(73) Assignee: Clarisay, Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/755,980

(22) Filed: Jan. 5, 2001

(51) Int. Cl.$^7$ ............................................. H01L 41/08
(52) U.S. Cl. ................................................... 310/313 R
(58) Field of Search ........................... 310/313 R, 363, 310/313 B; 333/155, 193; 29/25.35

(56) References Cited

U.S. PATENT DOCUMENTS

| | | | | |
|---|---|---|---|---|
| 4,381,469 A | * | 4/1983 | Ogawa et al. | 310/313 R |
| 4,684,841 A | * | 8/1987 | Este et al. | 310/313 B |
| 5,889,446 A | * | 3/1999 | Yamada et al. | 333/193 |
| 6,377,138 B1 | * | 4/2002 | Takagi et al. | 333/193 |

* cited by examiner

*Primary Examiner*—Thomas M. Dougherty
*Assistant Examiner*—Karen Addison

(57) ABSTRACT

A surface acoustic wave (SAW) device, a method of manufacturing the same and a SAW filter having at least one SAW device. In one embodiment, the SAW device includes: (1) a piezoelectric substrate, (2) a conductive layer located over the piezoelectric substrate and (3) a resistive layer, interposing a portion of the conductive layer and the piezoelectric substrate, that forms a return path for static charge migrating from the piezoelectric substrate to the conductive layer.

21 Claims, 4 Drawing Sheets

SYSTEM AND METHOD FOR DISSIPATING STATIC CHARGE GENERATED IN A SURFACE ACOUSTIC WAVE DEVICE

TECHNICAL FIELD OF THE INVENTION

The present invention is directed, in general, to surface acoustic wave (SAW) devices and, more specifically, to a system and method for dissipating static charge generated in a SAW device.

BACKGROUND OF THE INVENTION

Electronic signal processing by way of SAW devices has been widely adopted by the electronics industry. SAW devices can be designed to operate as analog electrical filters that function at over a wide range of frequencies. They also have several advantages over conventional technologies.

SAW devices can be designed to provide complex signal processing in a single unit. Saw devices also benefit being able to be mass-produced using conventional semiconductor fabrication techniques, leading to devices with little variation from device to device at a low cost. Such devices can be integrated into many digital communications systems and can be designed to operate in high harmonic modes in the gigahertz (GHz) frequency range.

The response characteristics of a particular SAW device are governed by several factors. One is the geometry of conductors laid out on the SAW resonator's piezoelectric substrate. A typical geometry for a SAW resonator includes first and second SAW finger sets. Portions of the finger sets are interdigitated in a central region of the SAW resonator and are employed to generate or attenuate acoustic waves. Additional non-interdigitated finger sets lie outside of the central region and serve to reflect acoustic waves back into the central region. Proper operation and containment of the acoustic waves require precise construction of both the central and outlying regions.

The interdigitated finger sets act as input and output signal ports when an AC voltage is applied to the signal input portion of the metal lines. Application of an appropriate input electrical AC signal provides the stimulus to create an acoustic wave that may typically be a Rayleigh wave with motion confined to about one acoustic wavelength under the free surface of the piezoelectric substrate. Alternatively, the acoustic excitation may be a "leaky wave," which also finds application in modern radio frequency devices. This wave is propagates to the receiver portion. The fingers corresponding to the signal receiving portion draw energy from the acoustic wave in the lattice and convert it into a filtered electrical signal.

However, effective operation at high frequencies and general reduction in device size require a SAW resonator with smaller, more closely spaced finger sets. An undesirable effect of these small geometries in that the metal lines become subject to failure. One particularly troublesome mechanism of failure results from formation of charge in the piezoelectric substrate. During heating cycles during the manufacturing process, the piezoelectric substrate develops mobile charge carriers. These charge carriers then tend to migrate to the conductive finger sets and accumulate at areas of low electrical potential, such as defect sites. If the charge carriers accumulate sufficiently, they arc, damaging or destroying the ability of the interdigitated metal lines to transmit and detect the surface acoustic wave.

Accordingly, what is needed in the art is a surface acoustic wave device and a method of manufacturing a surface acoustic wave device that reduces or eliminates the damage to the device resulting from charge carriers in the substrate.

SUMMARY OF THE INVENTION

To address the above-discussed deficiencies of the prior art, the present invention provides a SAW device, a method of manufacturing the same and a SAW filter having at least one SAW device. In one embodiment, the SAW device includes: (1) a piezoelectric substrate, (2) a conductive layer located over the piezoelectric substrate and (3) a resistive layer, interposing a portion of the conductive layer and the piezoelectric substrate, that forms a return path for static charge migrating from the piezoelectric substrate to the conductive layer.

The present invention is based in part on the recognition that piezoelectric and pyroelectric effects inherent in the piezoelectric substrate manifest themselves during the manufacture of a SAW device by generating charge carriers. These charge carriers migrate from the substrate to the overlying conductive layer and collect at points of low electrical potential. If the density of these charge carriers reaches a threshold, an electrical arc may be formed that could harm or destroy part of the conductive layer or the substrate. This may render the device inoperative.

In response to this problem, the present invention provides a convenient path for returning static charge from the conductive layer back to the underlying substrate. In one embodiment, the conductive path takes the form of a resistive layer interposing the conductive layer and the substrate. The resistance presented by the resistive layer should (but need not) be sufficiently small to prevent a harmful collection of charge carriers in the conductive layer, but sufficiently large so as not materially to impair subsequent operation of the SAW device.

In one embodiment of the present invention, the piezoelectric substrate includes one selected from the group consisting of: (1) bismuth germanium oxide, (2) gallium arsenide, (3) lithium borate, (4) lithium niobate, (5) lithium tantalate, (6) langasite, (7) lead zirconium tantalate, and (8) quartz. Those skilled in the pertinent art will understand that other currently-known and later-discovered materials may be suitable for use as a substrate, depending upon a particular application.

In one embodiment of the present invention, the conductive layer includes one selected from the group consisting of: (1) aluminum, (2) copper, (3) gold, (4) silver, (5) platinum and (6) palladium. Those skilled in the pertinent art will understand that other materials may be suitable for use as a conductive later, depending upon a particular application.

In one embodiment of the present invention, the resistive layer includes one selected from the group consisting of: (1) doped silicon, (2) titanium, (3) zirconium, (4) hafnium, (5) vanadium, (6) niobium, (7) tantalum, (8) molybdenum, (9) tungsten, (10) chromium, (11) nitrides thereof and (12) carbides thereof. Those skilled in the pertinent art will understand that other materials may be suitable for use as a resistive layer, depending upon a particular application.

In one embodiment of the present invention, the resistive layer couples a selected signal pad to one of a plurality of ground pads. In an embodiment to be illustrated and described, the SAW device includes two signal pads and four ground pads and the resistive layer is divided into portions that span the two signal pads and the four ground pads. In the illustrated and described embodiment, four resistors are formed.

In one embodiment of the present invention, the resistive layer interposes an entirety of a pad portion of the conductive layer and the piezoelectric substrate. The resistive layer may alternatively interpose only a portion of the pad portion of the conductive layer or may actually underlie a finger portion. The resistive layer should advantageously not materially alter operation of the SAW device, however.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
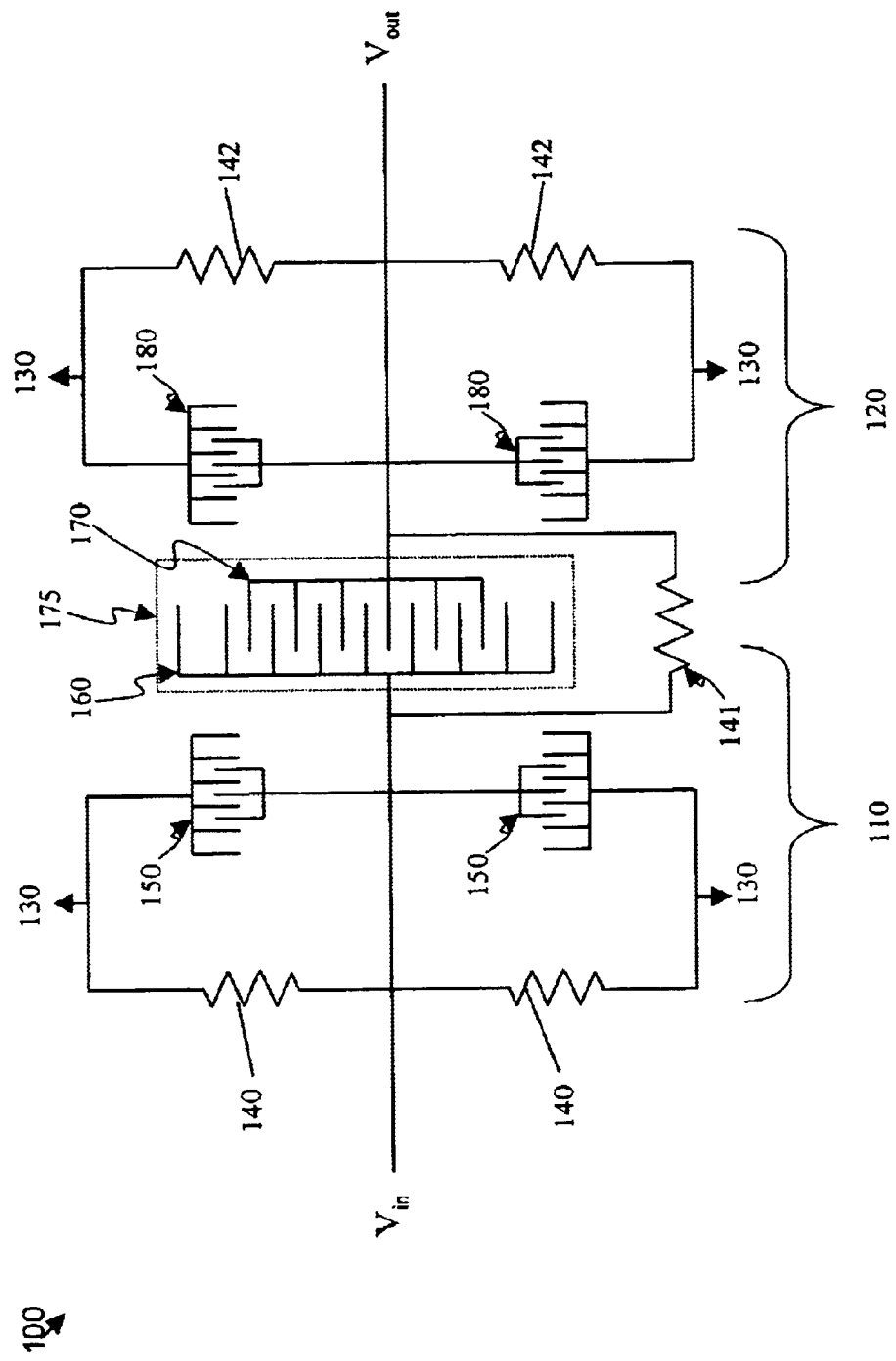
FIG. 1 illustrates a schematic diagram of a circuit incorporating a SAW device having two signal pads and four ground pads and a resistive layer divided into portions that span the two signal pads and the four ground pads constructed according to the principles of the present invention.

Referring initially to FIG. 1, illustrated is a schematic diagram of a circuit 100 of a SAW filter constructed according to the principles of the present invention. The circuit 100 includes an input signal pad 110 configured to receive an AC input voltage $V_{in}$, an output signal pad 120, and ground pads 130. The input pad 110 may include input resistors 140 coupled in parallel to secondary input SAW filter devices 150 and a primary SAW resonator element 160. The output signal pad 120 conducts an output voltage $V_{out}$ and includes a primary SAW receiving element 170 coupled in parallel to secondary output SAW filters 180 and output resistors 190.

The primary SAW resonator element 160 and the primary SAW receiving element 170 form a primary SAW filter device 175 on a piezoelectric substrate. The AC input voltage, $V_{in}$, is modified by the secondary SAW devices allowing the desired AC signal to reach the primary SAW resonator 160. The input voltage is converted to a SAW that transmits the input signal to the SAW receiver element 170. The AC resulting output signal may then be further modified by the secondary output SAW devices 180. It is highly desirable that the resistors 130, 190 not deleteriously affect the input and output signals.

Operating characteristics of the primary SAW filter 175, the secondary SAW devices 150, 180 and the resistive elements 140, 190 may be selected to tailor the frequency response characteristics of the SAW filter 100. The presence of the resistive elements 140, 190 provides convenient return pathways for static charge carriers accumulated in the common piezoelectric substrate by directing DC portions of the signal to the common electrical ground while allowing desired portions of the AC signal to pass through the primary SAW filter 175.

Figure 2:
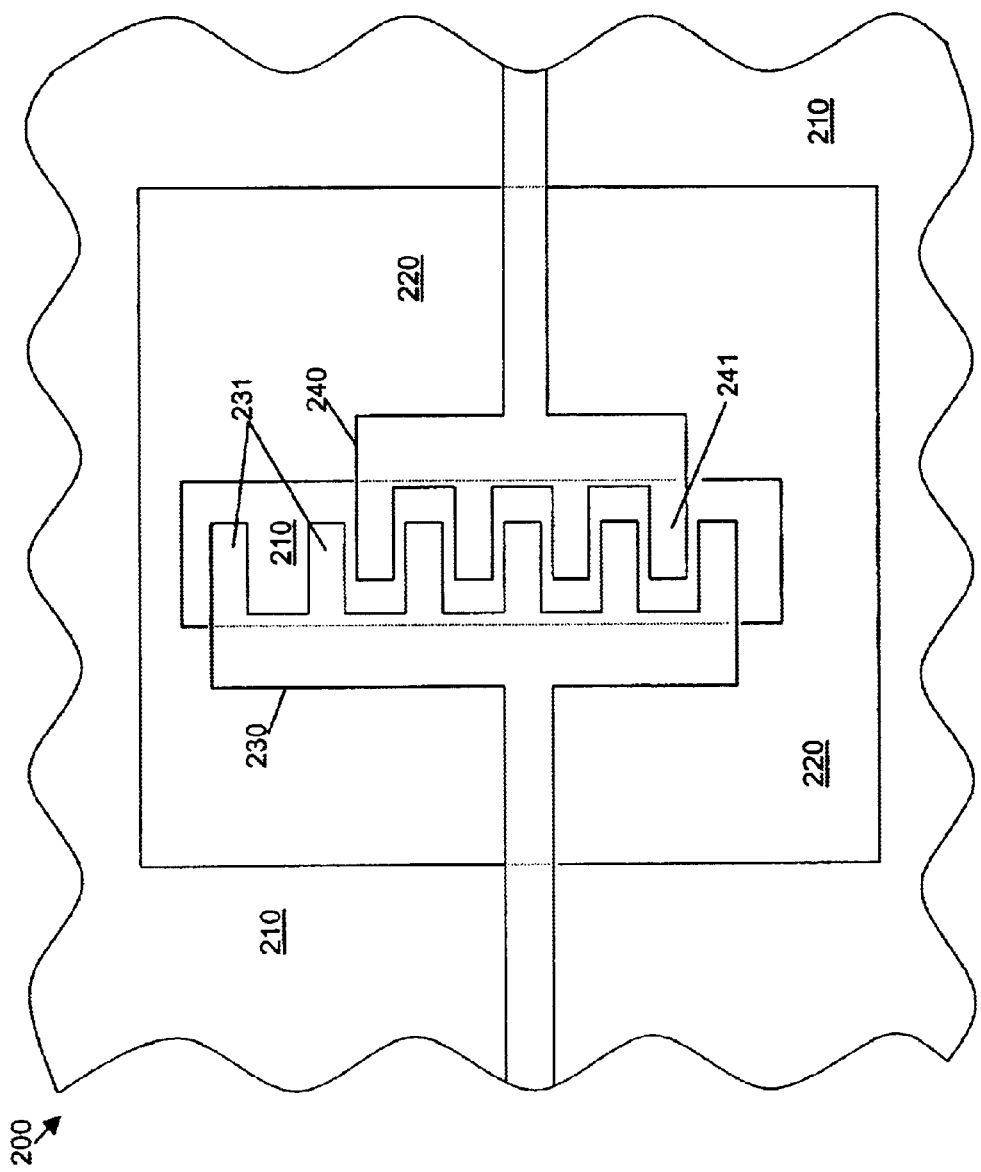
FIG. 2 illustrates a plan view of an embodiment of a SAW device incorporating the resistive layer constructed according to the principles of the present invention.

Turning now to FIG. 2, illustrated is a plan view 200 of an embodiment of a SAW device 200 incorporating the resistive elements of the circuit 100, constructed according to the principles of the present invention. For convenience, the illustration depicts only one SAW device and resistive element. One skilled in the art will understand that while the illustrated device represents one SAW filter, other SAW devices of the circuit may be constructed to incorporate the resistive layer in a similar manner. The illustrated embodiment of the SAW device 200 includes a piezoelectric substrate 210 having resistive layers 220 formed therein and electrically connected to a common electrical ground, such as a bond pad. Over the substrate 210 and a portion of a resistive region 220, the SAW device 200 may also include a SAW resonator element 230 having a first finger set 231. The SAW device 200 may also include a SAW receiving element 240 having a second finger set 241 similarly formed over the substrate 210 and a resistive region 220. The first and second finger sets 231, 241 are interdigitated in a central region. Additionally, the SAW device 200 may include reflective regions where the first and second finger sets 231, 241 may not be interdigitated.

Turning now to FIG. 3, illustrated is a cross-sectional view of an embodiment of the SAW device 200 constructed according to the principles of the present invention. The embodiment includes a piezoelectric substrate 310 formed of a material such as lithium tantalate. In other embodiments the substrate may be formed of bismuth germanium oxide, gallium arsenide, lithium borate, lithium niobate, lithium tantalate, langasite, lead zirconium tantalate, quartz, any combination thereof, or any material there including. One skilled in the art will understand that other piezoelectric materials, whether now-known or later-discovered, may serve as a suitable substrate, depending upon a particular application are not outside the scope of the present invention. In some embodiments, the substrate may take the form of a crystalline wafer.

Figure 3A:
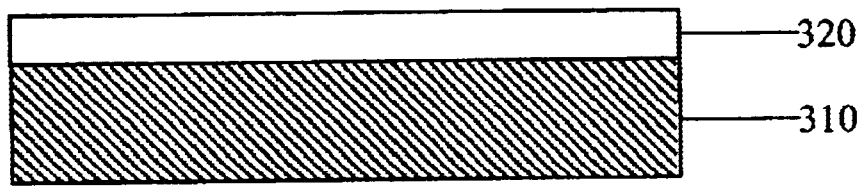
FIG. 3 illustrates a schematic cross-sectional view of an embodiment of a surface acoustic wave device constructed according to the principles of the present invention.
Figure 3B:
Figure 3C:
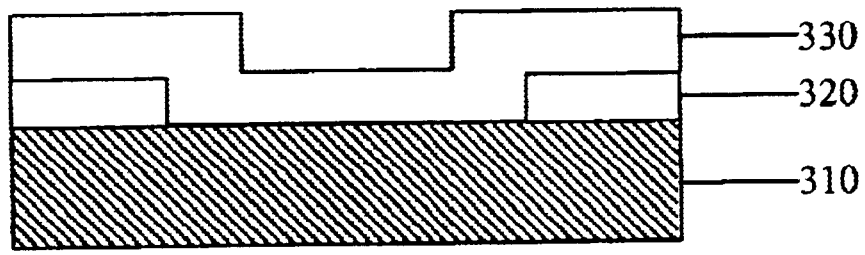

With reference now to FIGS. 3a–b, in an embodiment of the present invention, the piezoelectric substrate 310 is masked and etched to form cavities 320. A resistive layer 330 may be formed over the mask and within the cavities 320. The resistive layer 330 may be deposited by variety of techniques including chemical vapor deposition and physical vapor deposition. Such methods are well know to those skilled in the art. After depositing the resistive layer 330 over the surface, undesired portions of this layer may be removed, leaving the resistive layer 330 substantially in the cavities 320, as shown in FIG. 3c. Other methods for forming the resistive layer as depicted in FIG. 3c will be apparent to those skilled in the art and are within the scope of the invention.

In particularly advantageous embodiments, the resistive layer 330 may be tungsten. However, any material that, as formed, serves to conduct DC current to a ground pad will be suitable. Other examples of suitable materials for resistive layer 330 include doped silicon, titanium, zirconium, hafnium, vanadium, niobium, tantalum, molybdenum and chromium. The resistive layer may also include nitrides or carbides of the above mentioned materials. Where the resistive layer 330 includes a nitride or carbide, the layer may be formed by deposition of the metal in the presence of a reactive nitrogen or carbon source in the forming gas. In other embodiments, the layer may be formed by first depositing the metal followed by reaction to form the carbide or nitride. Those skilled in the pertinent art will understand that other materials may be suitable for use as the resistive layer, depending upon a particular application.

Whatever material is chosen, resistive layer 330 should be formed to have certain characteristics. The layer should allow desired portions of an AC signal to pass substantially unhindered. However, the resistive layer should also be capable of directing undesired static charges to the common electrical ground to which the layer is connected. In particular embodiments the common electrical ground may be one or more bond pads. The signal directing characteristics may depend on the intrinsic properties, such as resistivity, of the material comprising the resistive layer as well as the overall size and thickness of the regions. One skilled in the art may experimentally determine these characteristics to optimize the behavior of the device for a desired application.

Figure 3D:
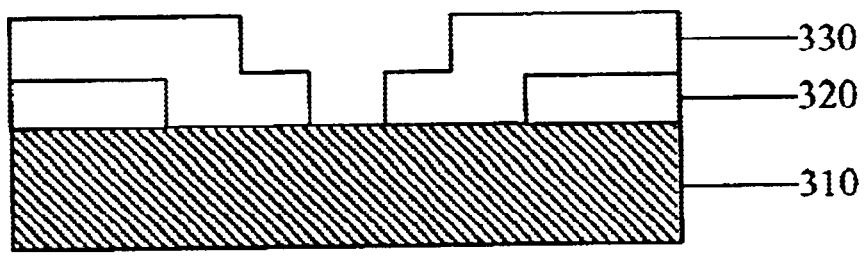

Referring to FIG. 3d with continuing reference to FIG. 2, conductive layer 340 is formed over the substrate surface and the resistive regions. Methods for forming such conductive layers are well known in the art. The conductive layer 340 includes the SAW device 200 having an input SAW resonator element 230 and a SAW receiving element 240. Methods of forming such resonator elements for SAW devices are well known to those skilled in the art. The conductive layer 340 may also include secondary SAW devices electrically connected to SAW device 200. In particular embodiments, conductive layer 340 may be formed over the resistive regions 330. In one embodiment of the present invention, the conductive layer 340 includes aluminum. However, the conductive layer 340 may also include materials such as copper, gold, silver, platinum and palladium. Those skilled in the pertinent art will understand that other materials may be suitable for use as a conductive later, depending upon a particular application.

Figure 4:
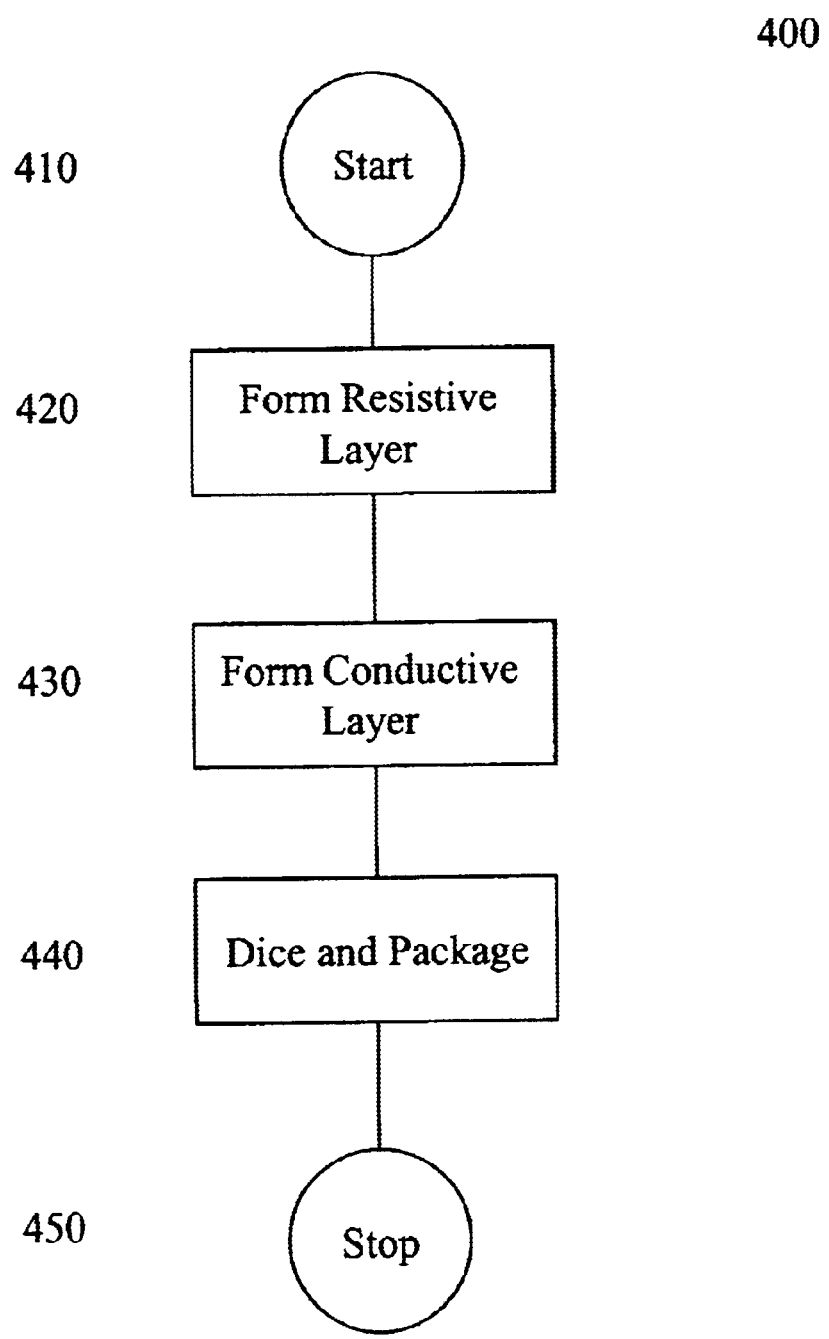
FIG. 4 illustrates a process flow diagram for forming a surface acoustic wave device carried out according to the principles of the present invention.

Turning now to FIG. 4, illustrated is a flow diagram of a process, generally designated 400, for forming a SAW device according to the principles of the present invention. The process 400 begins at a start step 410 where the substrate 310 is positioned. An action step 420 includes forming the resistive layer 330 in the substrate 310. The action step 430 also includes forming the conductive layer 340. One skilled in the art understands that forming the conductive layer 340 may require first patterning a photoresist, next depositing a metal and etching the photoresist. A second etch step may be required to refine the structure of the conductive layer 340. Other steps that may be included in the action step 430, such as flux coating and flux curing, are known to those skilled in the art. After forming the conductive layer 340, the action step 440 includes wafer-dice, die-attach, die-cut and packaging steps. The process is completed a stop step 440.

By this design and method, the resistive layer 330 serves to conduct spurious charge generated in the piezoelectric substrate away from the conductive layer 340. By conducting the charge away from the conductive layer 340, the charge may be discouraged from accumulating on the finger sets of the SAW elements and thereby reduce the damaging effects that such charge accumulation may produce.

Although the present invention has been described in detail, those skilled in the art should understand that they can make various changes, substitutions and alterations herein without departing from the spirit and scope of the invention in its broadest form.

What is claimed is:

1. A surface acoustic wave (SAW) device, comprising:
   a piezoelectric substrate;
   a conductive layer located over said piezoelectric substrate; and
   a resistive layer, interposing a portion of said conductive layer and said piezoelectric substrate, that forms a return path for static charge migrating from said piezoelectric substrate to said conductive layer.

2. The SAW device as recited in claim 1 wherein said piezoelectric substrate comprises one selected from the group consisting of:
   bismuth germanium oxide,
   gallium arsenide,
   lithium borate,
   lithium niobate,
   lithium tantalate,
   langasite,
   lead zirconium tantalate, and
   quartz.

3. The SAW device as recited in claim 1 wherein said conductive layer comprises one selected from the group consisting of:
   aluminum,
   copper,
   gold,
   silver,
   platinum, and
   palladium.

4. The SAW device as recited in claim 1 wherein said resistive layer comprises one selected from the group consisting of:
   silicon,
   titanium,
   zirconium,
   hafnium,
   vanadium,
   niobium,
   tantalum,
   molybdenum,
   tungsten,
   chromium,
   nitrides thereof, and
   carbides thereof.

5. The SAW device as recited in claim 1 wherein said resistive layer couples a selected signal pad to one of a plurality of ground pads.

6. The SAW device as recited in claim 1 wherein said resistive layer is interposed between an entirety of a pad portion of said conductive layer and said piezoelectric substrate.

7. The SAW device as recited in claim 1 wherein said SAW device comprises two signal pads and four ground pads and said resistive layer is divided into portions that span said two signal pads and said four ground pads.

8. A method of manufacturing a surface acoustic wave (SAW) device, comprising:
   providing a piezoelectric substrate;
   forming a conductive layer over said piezoelectric substrate; and
   creating a resistive layer between a portion of said conductive layer and said piezoelectric substrate, said resistive layer forming a return path for static charge migrating from said piezoelectric substrate to said conductive layer.

9. The method as recited in claim 8 wherein said piezoelectric substrate comprises one selected from the group consisting of:
   bismuth germanium oxide,
   gallium arsenide,
   lithium borate,
   lithium niobate,
   lithium tantalate,
   langasite,
   lead zirconium tantalate, and
   quartz.

10. The method as recited in claim 8 wherein said conductive layer comprises one selected from the group consisting of:
    aluminum, copper,
    gold,
    silver,
    platinum, and
    palladium.

11. The method as recited in claim 8 wherein said resistive layer comprises one selected from the group consisting of:
    silicon,
    titanium,
    zirconium,
    hafnium,
    vanadium,
    niobium,
    tantalum,
    molybdenum,
    tungsten,
    chromium,
    nitrides thereof, and
    carbides thereof.

12. The method as recited in claim 8 wherein said creating comprises coupling said resistive layer between a selected signal pad and one of a plurality of ground pads.

13. The method as recited in claim 8 wherein said creating comprises creating said resistive layer between an entirety of a pad portion of said conductive layer and said piezoelectric substrate.

14. The method as recited in claim 8 wherein said SAW device comprises two signal pads and four ground pads and said resistive layer is divided into portions that span said two signal pads and said four ground pads.

15. A surface acoustic wave (SAW) filter, comprising:
    a piezoelectric substrate;
    a conductive layer located over said piezoelectric substrate and forming a network of cooperating SAW devices; and
    a resistive layer, interposing a portion of said conductive layer and said piezoelectric substrate, that forms a return path for static charge migrating from said piezoelectric substrate to said conductive layer.

16. The SAW filter as recited in claim 15 wherein said piezoelectric substrate comprises one selected from the group consisting of:
    bismuth germanium oxide,
    gallium arsenide,
    lithium borate,
    lithium niobate,
    lithium tantalate,
    langasite,
    lead zirconium tantalate, and
    quartz.

17. The SAW filter as recited in claim 15 wherein said conductive layer comprises one selected from the group consisting of:
    aluminum,
    copper,
    gold,
    silver,
    platinum, and
    palladium.

18. The SAW filter as recited in claim 15 wherein said resistive layer comprises one selected from the group consisting of:
    silicon,
    titanium,
    zirconium,
    hafnium,
    vanadium,
    niobium,
    tantalum,
    molybdenum,
    tungsten,
    chromium,
    nitrides thereof, and
    carbides thereof.

19. The SAW filter as recited in claim 15 wherein said resistive layer couples a selected signal pad to one of a plurality of ground pads.

20. The SAW filter as recited in claim 15 wherein said resistive layer is interposed between an entirety of a pad portion of said conductive layer and said piezoelectric substrate.

21. The SAW filter as recited in claim 15 wherein said SAW device comprises two signal pads and four ground pads and said resistive layer is divided into portions that span said two signal pads and said four ground pads.

* * * * *